United States Patent
Manabe et al.

(10) Patent No.: US 9,190,409 B2
(45) Date of Patent: Nov. 17, 2015

(54) REPLACEMENT METAL GATE TRANSISTOR WITH CONTROLLED THRESHOLD VOLTAGE

(71) Applicants: Renesas Electronics Corporation, Kawasaki-shi (JP); International Business Machines Corporation, Armonk, NY (US)

(72) Inventors: Kenzo Manabe, Kawasaki (JP); Hemanth Jagannathan, Armonk, NY (US)

(73) Assignees: Renesas Electronics Corporation, Kawasaki-shi, Kanagawa (JP); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/187,745

(22) Filed: Feb. 24, 2014

(65) Prior Publication Data

US 2014/0239407 A1    Aug. 28, 2014

Related U.S. Application Data

(60) Provisional application No. 61/768,752, filed on Feb. 25, 2013.

(51) Int. Cl.
*H01L 27/092* (2006.01)
*H01L 21/8238* (2006.01)
*H01L 27/11* (2006.01)

(52) U.S. Cl.
CPC .... *H01L 27/0922* (2013.01); *H01L 21/823842* (2013.01); *H01L 21/823857* (2013.01); *H01L 27/11* (2013.01)

(58) Field of Classification Search
CPC ............... H01L 27/0922; H01L 27/11; H01L 21/823857; H01L 21/823842
USPC ............................................... 257/369; 3/369
See application file for complete search history.

(56) References Cited

U.S. PATENT DOCUMENTS

| | | | |
|---|---|---|---|
| 8,084,311 B1 | 12/2011 | Horak et al. | |
| 8,293,632 B2 | 10/2012 | Kadoshima et al. | |
| 2003/0075766 A1 | 4/2003 | Lin et al. | |
| 2004/0132296 A1 | 7/2004 | Lin et al. | |
| 2005/0110098 A1 | 5/2005 | Yoshihara | |
| 2006/0084217 A1 | 4/2006 | Luo et al. | |
| 2009/0068828 A1 | 3/2009 | Chambers et al. | |
| 2009/0152636 A1 | 6/2009 | Chudzik et al. | |
| 2009/0179283 A1 | 7/2009 | Adams et al. | |
| 2010/0044806 A1 | 2/2010 | Hou et al. | |
| 2010/0164011 A1* | 7/2010 | Frank et al. | 257/369 |
| 2010/0320547 A1 | 12/2010 | Ando et al. | |
| 2011/0156166 A1 | 6/2011 | Huang et al. | |
| 2011/0175170 A1* | 7/2011 | Wang et al. | 257/369 |

(Continued)

*Primary Examiner* — Yu Chen
*Assistant Examiner* — Nilufa Rahim
(74) *Attorney, Agent, or Firm* — McGinn IP Law Group, PLLC

(57) ABSTRACT

A method and structure for a semiconductor device includes a semiconductor substrate and an N-channel transistor and a P-channel transistor provided on the semiconductor substrate. Each of the N-channel transistor and the P-channel transistor has a gate dielectric film on the semiconductor substrate, and a gate electrode is formed on the gate dielectric. The gate electrode comprises a metal conductive layer. The oxygen concentration in the metal conductive layer for the N-channel transistor is different from that for the P-channel transistor.

19 Claims, 2 Drawing Sheets

(56) References Cited

U.S. PATENT DOCUMENTS

| | | |
|---|---|---|
| 2011/0207280 A1 | 8/2011 | Ando et al. |
| 2011/0260255 A1 | 10/2011 | Wang et al. |
| 2011/0298060 A1 | 12/2011 | Chen et al. |
| 2012/0018810 A1* | 1/2012 | Chambers et al. ............ 257/369 |
| 2012/0086075 A1 | 4/2012 | Huang et al. |
| 2012/0184093 A1 | 7/2012 | Chudzik et al. |
| 2012/0193726 A1 | 8/2012 | Yamashita et al. |
| 2012/0228715 A1 | 9/2012 | Niimi et al. |
| 2012/0261773 A1* | 10/2012 | Ogawa .......................... 257/412 |
| 2014/0154877 A1* | 6/2014 | Besser et al. .................. 438/586 |
| 2014/0213048 A1* | 7/2014 | Sun et al. ...................... 438/592 |

\* cited by examiner

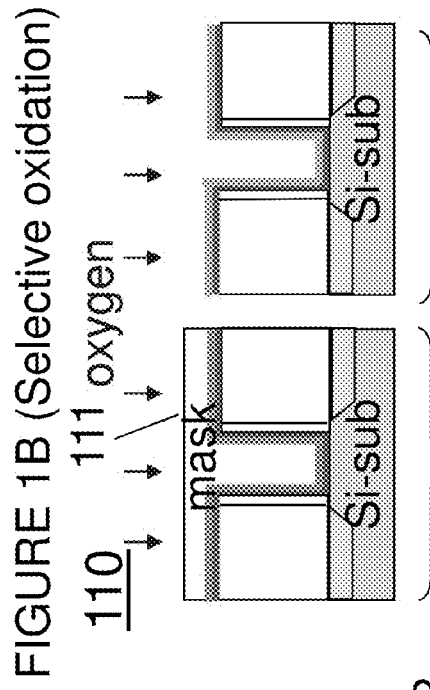
FIGURE 1B (Selective oxidation)
110
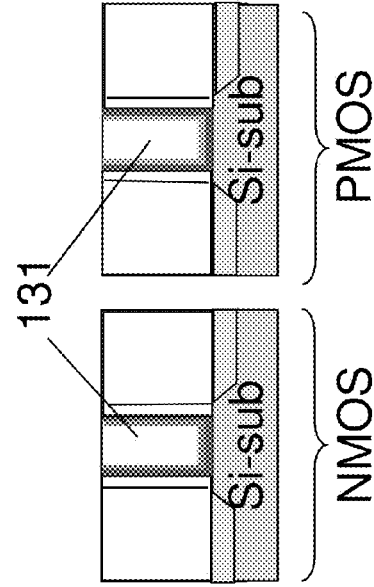
FIGURE 1D (Deposition/CMP of Fill metal)
130
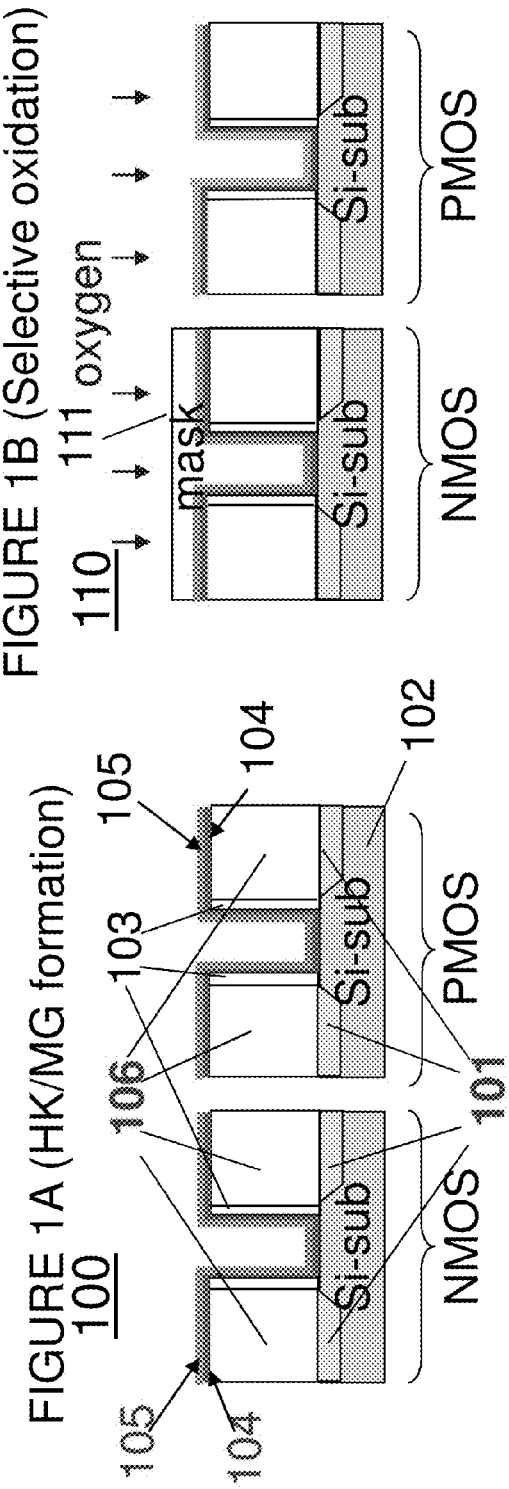
FIGURE 1A (HK/MG formation)
100
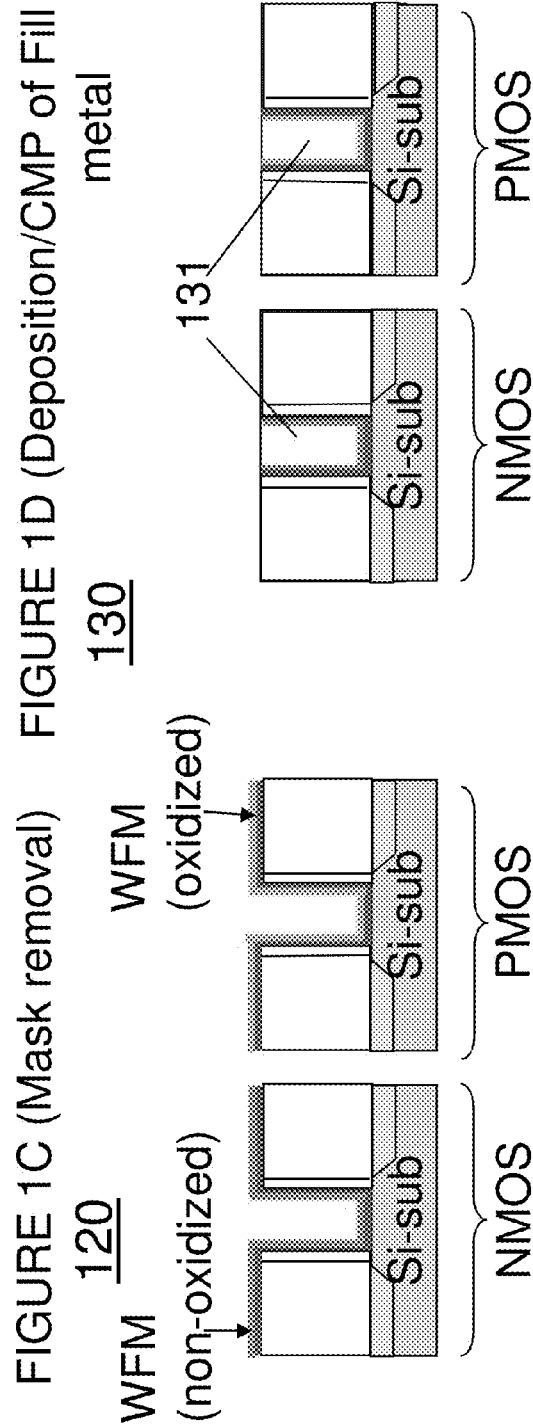
FIGURE 1C (Mask removal)
120

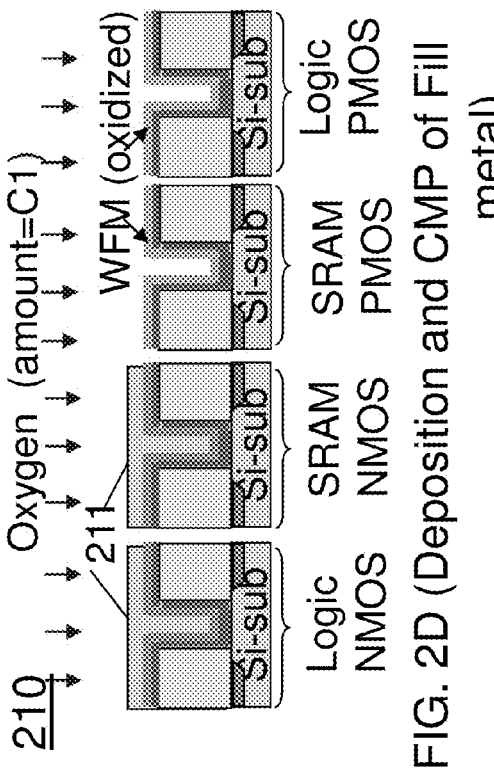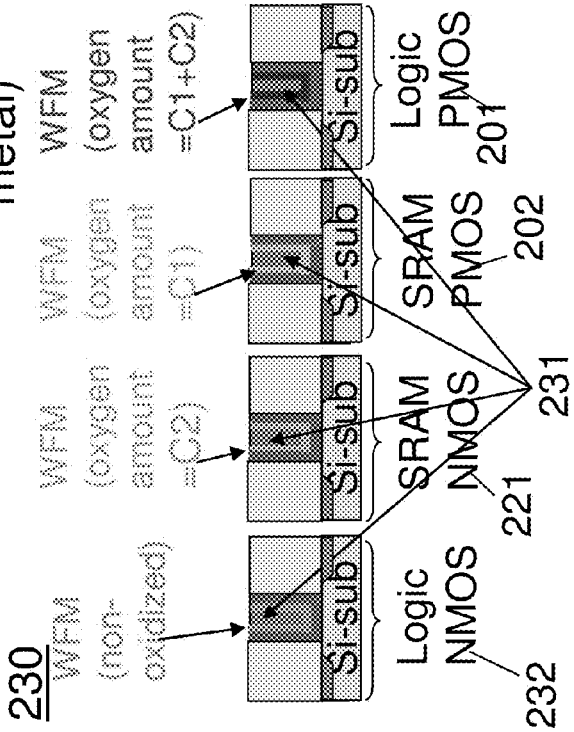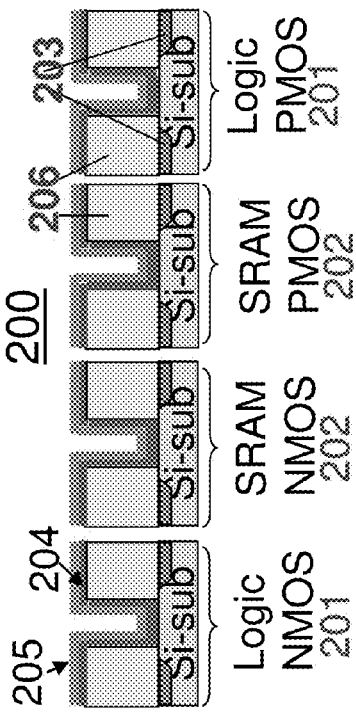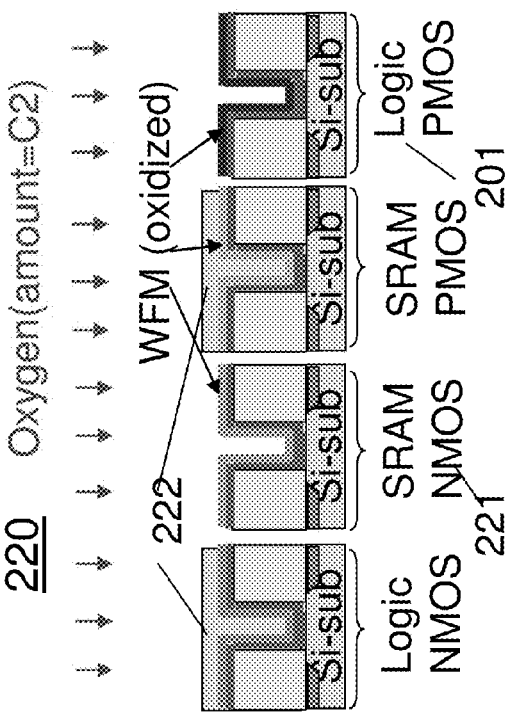

REPLACEMENT METAL GATE TRANSISTOR WITH CONTROLLED THRESHOLD VOLTAGE

This Application is a non-provisional application of Provisional Application No. 61/768,752, filed on Feb. 25, 2013, and claims priority thereto.

BACKGROUND OF THE INVENTION

1. Field of the Invention

The present invention generally relates to controlling threshold voltage (Vth) for replacement metal gate (RMG) transistors. More specifically, a work function metal (WFM), such as TiC(Al), is inserted in NMOS and PMOS regions and then selectively oxidized to control Vth for different threshold voltages.

2. Description of the Related Art

Metal-oxide-semiconductor (MOS) transistors have typically utilized polysilicon gate electrodes due to its thermal resistive properties, since polysilicon can better withstand subsequent high temperature processing. This high temperature processing characteristic allowed polysilicon to be annealed at high temperatures along with source and drain regions. Additionally, polysilicon can advantageously block ion implantation of doped atoms into a channel region, and, due to this ion implantation blocking potential, the polysilicon allows for easy formation of self-aligned source and drain structures after gate patterning is completed.

However, polysilicon gate electrodes have higher resistivities than most metal materials. Therefore, polysilicon gate electrodes may operate at much slower speeds than gates made of metallic materials. To partially compensate for this higher resistance, polysilicon materials have been subjected to extensive and expensive silicide processing in order to increase their speed of operation to acceptable levels.

Recently, metal gate electrodes have evolved for improving the drive current by reducing polysilicon depletion, and reducing processing temperatures subsequent to metal gate formation. In the replacement metal gate process flow, a dummy gate, such as polysilicon, is removed by dry/wet etching, followed by metal deposition. In this approach, a dummy gate is formed on a semiconductor wafer through using standard polysilicon gate CMOS process flow, wherein source and drain regions are first formed using an initial gate structure used for alignment of the source/drain implantation, and the gate structure is then replaced by metal.

For example, a dielectric layer and polysilicon layer are deposited on the semiconductor substrate, which are then patterned to form the dummy gate, and gate sidewall structures are formed for the dummy gate. Source/drain regions are then formed on the semiconductor using conventional implantation processes. An insulator layer is then deposited about the dummy gate. The insulator layer is then polished to expose the polysilicon layer of dummy gate. The dummy gate is then removed by reactive ion etching (RIE) and/or wet chemical etching to form a trench in the insulator layer, and a metal is then deposited within the trench to form the metal gate.

In general, dual metal gate complementary metal oxide semiconductor (CMOS) integration schemes employ two gate materials, one having a work function near the valence band edge of the semiconductor material in the channel and the other having a work function near the conduction band edge of the same semiconductor material. In CMOS devices having a silicon channel, a conductive material having a work function of 4.0 eV is necessary for n-type metal oxide semiconductor field effect transistors (NMOSFETs, or "NFETs") and another conductive material having a work function of 5.0 eV is necessary for p-type metal oxide semiconductor field effect transistors (PMOSFETs, or "PFETs").

In conventional CMOS devices employing polysilicon gate materials, a heavily p-doped polysilicon gate and a heavily n-doped polysilicon gate are employed to address these needs. In CMOS devices employing high-k gate dielectric materials, two types of gate stacks comprising suitable materials satisfying the work function requirements are needed for the PFETS and for the NFETS, in which the gate stack for the PFETs provides a flat band voltage closer to the valence band edge of the material of the channel of the PFETs, and the gate stack for the NFETs provides a flat band voltage closer to the conduction band edge of the material of the channel of the NFETs. In other words, threshold voltages need to be optimized differently between the PFETs and the NFETs.

Thus, the manufacture of dual metal gate CMOS structures is difficult because two types of metal gate electrodes are needed to provide different work functions. Integration of dual gate CMOS structures with a replacement gate structure is even more difficult because of the difficulty in patterning different metal layers in replacement gate geometries.

Moreover, it is difficult to control threshold voltage Vth for replacement metal gate (RMG) transistors. Formation of different metal gate electrodes for different polarity (e.g., PMOS/NMOS) and different threshold voltages results in high cost because the fabrication process is complex. Additionally, such complexity causes low yield because of damage on the gate dielectric during device fabrication.

SUMMARY OF THE INVENTION

In view of the foregoing, and other, exemplary problems, drawbacks, and disadvantages of the conventional systems, it is an exemplary feature of the present invention to provide a structure (and method) in which different threshold voltages Vth can be selectively and precisely controlled for RMG transistors.

It is another exemplary feature of the present invention to provide a structure and method for forming different metal gate electrodes for transistors with different polarities (e.g., PMOS/NMOS) and different threshold voltages.

In a first exemplary aspect of the present invention, to achieve the above features and objects, described herein is a semiconductor device, comprising a semiconductor substrate and an N-channel transistor and a P-channel transistor provided on the semiconductor substrate, each of the N-channel transistor and the P-channel transistor having a gate dielectric film on the semiconductor substrate, and a gate electrode formed on the gate dielectric, wherein the gate electrode comprises a metal conductive layer, and wherein the oxygen concentration in the metal conductive layer for the N-channel transistor is different from that for the P-channel transistor.

In a second exemplary aspect of the present invention, also described herein is a method for fabricating a semiconductor device, including: forming, on a substrate having an N-channel region and a P-channel region, a dummy gate dielectric and dummy gate electrodes; forming a pair of side wall spacers on the substrate at both sides of the dummy gate electrode; forming a source region and a drain region in a surface of the substrate at the both sides of the gate electrode and the side wall; forming a dielectric layer over the gate electrode, the side wall, and the source and drain regions; exposing a top surface of the dummy gate electrode; forming a trench by removing the dummy gate electrode and the dummy gate dielectric; forming a gate dielectric layer and a metal conductive layer; selectively incorporating oxygen into the metal conductive layer on the P-channel transistor, wherein a concentration of oxygen in the metal conductive layer for the N-channel region is different from a concentration of oxygen for the P-channel region.

In a third exemplary aspect of the present invention, also described herein is a semiconductor device, including a substrate, a first plurality of replacement metal gate (RMG) transistors in a logic region of the substrate, the first plurality of RMG transistors comprising an NMOS logic transistor and a PMOS logic transistor, and a second plurality of RMG transistors in a SRAM (static random access memory) region of the substrate, the second plurality of RMG transistors comprising an NMOS SRAM transistor and a PMOS SRAM transistor. A same metal is used for gates in both the first plurality of RMG transistors and the second plurality of RMG transistors, and the metal has different oxygen concentrations in each of the NMOS logic transistor, the PMOS logic transistor, the NMOS SRAM transistor, and the PMOS SRAM transistor.

A key benefit of the structure and method of the present invention is that RMG transistors with high yield and at low cost can be provided, with threshold voltage Vth being precisely controlled for these RMG transistors.

BRIEF DESCRIPTION OF THE DRAWINGS

The foregoing and other purposes, aspects and advantages will be better understood from the following detailed description of a preferred embodiment of the invention with reference to the drawings, in which:

FIGS. 1A-1D show exemplary fabrication steps for a first exemplary embodiment; and FIGS. 2A-2D show exemplary fabrication steps for a second exemplary embodiment.

DETAILED DESCRIPTION OF AN EXEMPLARY EMBODIMENT OF THE INVENTION

Referring now to the drawings, and more particularly to FIGS. 1A-2D, exemplary embodiments of the method and structures according to the present invention will now be described.

A key feature of the present invention is the selective incorporation of oxygen into metal gate electrodes used to form metal gate electrodes with different polarity (PMOS/NMOS) and different threshold voltages. This formation of RMG simplifies the process to form metal gate electrodes to obtain appropriate Vth's and to avoid the damage on gate dielectric during the above formation process because no removal of metal gate electrodes on gate dielectrics is needed.

If the oxidized metal gate electrodes contain an element such as aluminum (Al), Vth is stabilized against thermal budget due to the high thermal stability of its oxide. In a preferred exemplary embodiment TiC(Al) is used for the metal gate electrode. In this manner, the present invention can achieve RMG transistors with high yield and at low cost.

FIGS. 1A through 1D exemplarily show the fabrication process using a work function metal (WFM) and selective oxidation for this Vth control. It is noted that FIG. 1A shows a stage 100 of fabrication for CMOS that is well known in the art for conventional RMG fabrication, including the formation of the source and drain diffusion regions 101 on substrate 102, as using polysilicon as a dummy gate structure, to permit formation of the source/drain regions 101. FIG. 1A shows an exemplary resultant structure from the conventional RMG process, including formation of the gate sidewall spacers 103 and the interlayer dielectric 106.

That is, FIG. 1A shows the dummy poly-Si gates as having already been removed and the deposition of high-k (HK) gate dielectric 104, such as HfO2, and work function metal 105 (WFM), such as TiC(Al), in NMOS and PMOS transistor regions. In a variation, a barrier layer (not shown in FIG. 1A) such as TiN may be inserted into the interface between the WFM and the HK gate dielectric.

This optional barrier layer can be useful when it is desired to prevent an increase in the thickness of interfacial layer between the HK dielectric and Si substrate. Therefore, the gate capacitance can be larger compared to the device without the HK barrier layer so that the drain current can be larger.

FIG. 1B shows the selective oxidation stage 110 of only the WFM on the PMOS region by using a mask 111 in the NMOS region. FIG. 1C shows the stage 120 in which the mask 111 has been removed, and FIG. 1D shows the stage 130 after which deposition and CMP of a fill metal 131, such as tungsten W, has occurred.

By the above process flow, the appropriate Vth for NMOS and PMOS can successfully be achieved because the effective work function (EWF) can be controlled by adjusting the oxygen concentration in the WFM. In this case, the EWF for the WFM increases by increasing the oxygen concentration in the WFM.

The above formation of RMG simplifies the process to form metal gate electrodes to obtain appropriate Vth's for different devices. It also has the advantage that it avoids damage on the gate dielectric electrode during the above formation process because no removal of metal gate electrodes on gate dielectrics is needed, as in other processes for RMG fabrication.

Moreover, it is noted that the existence of Al in the WFM, such as TiAlC, stabilizes the Vth controlled by adjusting the oxygen concentration because Al can form a strong bond with oxygen. Therefore, overall, the present invention provides an RMG transistor with high yield and at low cost.

A second exemplary embodiment demonstrates how the present invention achieves multi-Vth control by selective oxidation, by which RMG transistors are fabricated with multi-Vth's for logic transistors 201 and for SRAM (static random access memory) transistors 202, using the following process flow, as exemplarily shown in FIGS. 2A-2D. It is noted that in the fabrication stage 200 shown in FIG. 2A, the dummy poly-Si gates have already been removed from the interlayer dielectric 206 on the source/drain regions 203 and high-k (HK) gate dielectric 204 and work function metal (WFM) 205 are deposited in sequence in logic region 201 and SRAM region 202, and the sidewall structures are not shown in the figures for this exemplary embodiment, although one having ordinary will understand that such sidewall are present, similar to the side wall structures in FIG. 1. The effective work function (EWF) for the WFM 205 is set to be about 4.3 eV, which is necessary to achieve Vth for Logic NMOS.

A barrier layer (not shown) such as TiN may be inserted into the interface between the WFM 205 and the HK gate dielectric 204, similar to the optional barrier layer mentioned for the first embodiment.

In fabrication stage 210 shown in FIG. 2B, a first selective oxidation of the WFM 205 on logic PMOS region 201 and SRAM PMOS region 202 is achieved, by using a first mask 211. The oxygen amount for this first selective oxidation is C1.

In stage 220 shown in FIG. 2C, a second selective oxidation of the WFM on the logic PMOS region 201 and the SRAM NMOS region 221 is achieved, by using a second mask 222. It is assumed that this second selective oxidation provides amount C2 of oxygen.

Finally, in step 230 shown in FIG. 2D, the deposition and CMP of a fill metal 231, such as tungsten W, are achieved. It is noted that the four different transistor regions have different oxygen amounts in their WFMs: the logic NMOS transistor 232 has no oxidation added; the SRAM NMOS transistor 221 has oxygen amount C2; the SRAM PMOS transistor 202 has oxygen amount C1; and the logic PMOS transistor 201 has oxygen amount (C1+C2).

As non-limiting examples, if the EWF for Logic NMOS is 4.3 eV, C1 and C2 should give the EWF changes of about 400 mV and 200 mV, respectively, so that the EWF's for SRAM NMOS, SRAM PMOS and Logic PMOS become 4.5 eV, 4.7 eV and 4.9 eV, respectively, which are appropriate for those devices. The desirable oxygen concentration (C1, C2) might be expected to range from $10^{18}$ to $10^{21}$ atoms/cm$^3$.

By this process flow, the oxygen concentration in the WFM is set so that the EWF on each region gives an appropriate Vth for logic NMOS/PMOS and for SRAM NMOS/PMOS. Again, it is noted that the EWF for the WFM increases with increasing the oxygen concentration in the WFM. The order of necessary EWF values for each transistor is as follows: Logic NMOS<SRAM NMOS<SRAM PMOS<Logic PMOS.

The rationale for this EWF relationship is that EWFs for Logic NMOS and PMOS should ideally be close to the Si conduction band edge (4.05 eV) and the Si valance band edge (5.15 eV), respectively, to obtain the low Vth's necessary for higher drain current at the ON state of transistors, which is effective for increasing the Logic circuit speed. On the other hand, SRAM transistors need higher Vth's compared to Logic transistors in order to lower the drain current at the OFF state of transistors, which is effective for suppressing the power consumption in the SRAM circuits. Therefore, the EWFs for SRAM NMOS and PMOS should ideally be closer to Si midgap (4.6 eV) than those for Logic NMOS and PMOS, respectively. Putting these ideal EWF constraints together provides the inequality identified above.

The above formation of RMG simplifies the process to form metal gate electrodes to obtain appropriate Vth's and to avoid the damage on gate dielectric during the above formation process. Again, using in Al in the WFM stabilizes the Vth controlled by adjusting the oxygen concentration because Al can form a strong bond with oxygen, so that RMG transistors with high yield and at low cost can be provided.

While the invention has been described in terms of various exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

Having thus described my invention, what I claim as new and desire to secure by Letters Patent is as follows:

1. A semiconductor device, comprising:
a semiconductor substrate; and
an N-channel transistor and a P-channel transistor provided on the semiconductor substrate, each of the N-channel transistor and the P-channel transistor respectively having a gate dielectric film on said semiconductor substrate, and a gate electrode respectively formed on said gate dielectric,
wherein each said gate electrode comprises a metal conductive layer,
wherein an oxygen concentration in said metal conductive layer for the N-channel transistor differs from that for the P-channel transistor,
wherein said metal conductive layer includes a component which serves to provide a work function metal having a strong bond with oxygen so as to provide a high thermal stability, and
wherein said component providing a strong bond with oxygen comprises aluminum.

2. A semiconductor device according to claim 1, wherein the oxygen concentration in said metal conductive layer for said N-channel transistor and said P-channel transistor is 0.1 to 50 atomic %.

3. A semiconductor device according to claim 1, wherein the metal in said metal conductive layer comprises TiAlC.

4. A semiconductor device according to claim 1, wherein a barrier metal layer is inserted at an interface between said metal conductive layer and said gate dielectric.

5. A semiconductor device according to claim 4, wherein said barrier metal layer comprises TiN.

6. A semiconductor device according to claim 1, wherein said N-channel transistor and said P-channel transistor comprise a first N-channel transistor and a first P-channel transistor in a logic transistor region, said semiconductor device further comprising:
a second N-channel transistor; and
a second P-channel transistor,
wherein said second N-channel transistor and second P-channel transistor comprise transistors in a SRAM (static random access memory) region, and
wherein each of the second N-channel transistor and the second P-channel transistor respectively having a gate dielectric film on said semiconductor substrate, and a gate electrode respectively formed on said gate dielectric,
wherein each said gate electrode comprises said metal conductive layer, and
wherein an oxygen concentration in said metal conductive layer for the second N- channel transistor differs from that for the second P-channel transistor.

7. A semiconductor device according to claim 6, wherein the oxygen concentrations in said metal conductive layer for the second N-channel transistor and second P-channel transistor differ from those for the first N-channel transistor and the first P-channel transistor.

8. A semiconductor device according to claim 7, wherein said different oxygen concentrations provide different effective work functions (EWFs) for said first N-channel transistor, said first P-channel transistor, said second N-channel transistor, and said second P-channel transistor.

9. A method for fabricating a semiconductor device, said method comprising:
forming, on a substrate having an N-channel region and a P-channel region, a dummy gate dielectric and dummy gate electrode, respectively, for an N-channel transistor and for a P-channel transistor;
forming a pair of side wall spacers on said substrate at both sides of said dummy gate electrodes;
forming a source region and a drain region in a surface of said substrate at the both sides of said dummy gate electrode and said side wall, respectively, for said N-channel transistor and said P-channel transistor;
forming a dielectric layer over said dummy gate electrode, said side wall, said source region, and said drain region;
exposing a top surface of said dummy gate electrode;
forming a trench by removing said dummy gate electrode and said dummy gate dielectric;

forming a gate dielectric layer and a metal conductive layer comprising a gate electrode for each said N-channel transistor and P-channel transistor, using a same metal conductive layer material, said metal conductive layer including a component which serves to provide a work function metal having a strong bond with oxygen so as to provide a high thermal stability;

wherein said component providing a strong bond with oxygen comprises aluminum; selectively incorporating oxygen into said metal conductive layer on the P-channel transistor;

wherein a concentration of oxygen in said metal conductive layer for the N-channel region is different from a concentration of oxygen for the P-channel region.

10. A method for fabricating a semiconductor device according to claim 9, wherein, in said incorporating oxygen into said metal conductive layer on the P-channel transistor selectively, the incorporating oxygen is conducted by an oxygen radical.

11. A method for fabricating a semiconductor device according to claim 9, wherein a low energy ion implantation is used for said selectively incorporating oxygen into said metal conductive layer on the P-channel transistor.

12. A method for fabricating a semiconductor device according to claim 9, further comprising selectively incorporating oxygen in said metal conductive layer for the N-channel transistor.

13. A method for fabricating a semiconductor device according to claim 12, wherein said N-channel transistor and said P-channel transistor comprise a first N-channel transistor and a first P-channel transistor in a SRAM (static random access memory) transistor region, said semiconductor device further comprising:

forming a second N-channel transistor; and
forming a second P-channel transistor,
wherein said second N-channel transistor and second P-channel transistor comprise transistors in a logic transistor region, and
wherein each of the second N-channel transistor and the second P-channel transistor respectively having said gate dielectric film on said semiconductor substrate, and said gate electrode respectively formed on said gate dielectric, wherein each said gate electrode comprises said same metal conductive layer material, and
wherein an oxygen concentration in said metal conductive layer for the second N-channel transistor differs from that for the second P-channel transistor.

14. A method for fabricating a semiconductor device according to claim 13, wherein said different oxygen concentrations of said same metal layer causes different effective work functions (EWF) of said gate electrodes, and wherein an order of EWF values for each of said first and second N-channel and P-channel transistors is as follows: Logic NMOS <SRAM NMOS <SRAM PMOS <Logic PMOS.

15. A method for fabricating a semiconductor device according to claim 14, wherein said different oxygen concentrations range from $10^{18}$ to $10^{21}$ atoms/cm$^3$.

16. A semiconductor device, comprising:
a substrate;
a first plurality of replacement metal gate (RMG) transistors in a logic region of said substrate, said first plurality of RMG transistors comprising an NMOS logic transistor and a PMOS logic transistor; and
a second plurality of RMG transistors in a SRAM (static random access memory) region of said substrate, said second plurality of RMG transistors comprising an NMOS SRAM transistor and a PMOS SRAM transistor,
wherein a same metal is used for gates in both said first plurality of RMG transistors and said second plurality of RMG transistors, and
wherein said same metal has different oxygen concentrations in each of said NMOS logic transistor, said PMOS logic transistor, said NMOS SRAM transistor, and said PMOS SRAM transistor.

17. The semiconductor device of claim 16, wherein said metal includes a component that forms a strong bond with oxygen, thereby allowing said metal to stabilize threshold voltages in said RMG transistors.

18. The semiconductor device of claim 17, wherein said metal comprises TiAlC.

19. A semiconductor device according to claim 17, wherein a barrier metal layer is inserted at an interface between said metal and a gate dielectric used in said transistors.

* * * * *